(12) United States Patent
Buhagiar

(10) Patent No.: US 11,159,045 B2
(45) Date of Patent: Oct. 26, 2021

(54) FACILITY FOR MONITORING A PORTION OF A HIGH-VOLTAGE ELECTRICAL POWER TRANSMISSION NETWORK

(71) Applicant: RTE Reseau de transport d'electricite, Paris la Defense (FR)

(72) Inventor: Thierry Buhagiar, Marseilles (FR)

(73) Assignee: RTE Reseau de transport d'electricite, Paris la Defense (FR)

( * ) Notice: Subject to any disclaimer, the term of this patent is extended or adjusted under 35 U.S.C. 154(b) by 287 days.

(21) Appl. No.: 16/070,143

(22) PCT Filed: Jan. 19, 2017

(86) PCT No.: PCT/FR2017/050110
§ 371 (c)(1),
(2) Date: Jul. 13, 2018

(87) PCT Pub. No.: WO2017/125684
PCT Pub. Date: Jul. 27, 2017

(65) Prior Publication Data
US 2019/0027962 A1 Jan. 24, 2019

(30) Foreign Application Priority Data
Jan. 21, 2016 (FR) ..................... 1650467

(51) Int. Cl.
*G05B 19/042* (2006.01)
*H02J 13/00* (2006.01)
*G01R 19/25* (2006.01)

(52) U.S. Cl.
CPC ...... *H02J 13/0017* (2013.01); *G01R 19/2513* (2013.01); *G05B 19/042* (2013.01);
(Continued)

(58) Field of Classification Search
CPC .............. G01R 19/2513; G05B 19/042; G05B 2219/2639; Y02E 60/7838; Y02E 60/74; Y04S 40/124; Y04S 10/30
See application file for complete search history.

(56) References Cited

U.S. PATENT DOCUMENTS

| | | | |
|---|---|---|---|
| 2007/0206644 A1 | 9/2007 | Bertsch et al. | |
| 2010/0204851 A1* | 8/2010 | Yuen | H02J 3/06 700/297 |

(Continued)

FOREIGN PATENT DOCUMENTS

| | | |
|---|---|---|
| EP | 1 830 450 A1 | 9/2007 |
| EP | 2 840 675 A2 | 2/2015 |
| WO | WO 2010/118550 A1 | 10/2010 |
| WO | WO 2011/076242 A1 | 6/2011 |

OTHER PUBLICATIONS

Zheng, Y., Wang, D., Zhou, Z. et al. J. Mod. Power Syst. Clean Energy (2014) 2: 282. https://doi.org/10.1007/s40565-014-0070-2 (Year: 2014).*

(Continued)

*Primary Examiner* — Kenneth M Lo
*Assistant Examiner* — Istiaque Ahmed
(74) *Attorney, Agent, or Firm* — Oblon, McClelland, Maier & Neustadt, L.L.P.

(57) ABSTRACT

A facility for monitoring a portion of a high-voltage electrical power transmission network includes: a plurality of local electrical stations for connecting high-voltage lines, each local electrical station implementing a first communication protocol dedicated to an internal communication between electrical devices; at least one remote monitoring site connected to each of the local electrical stations by a remote control network implementing a second communication protocol dedicated to the remote control. One of the local electrical stations, as a main electrical station, includes an automated mechanism for additional monitoring config- (Continued)

Figure 3:
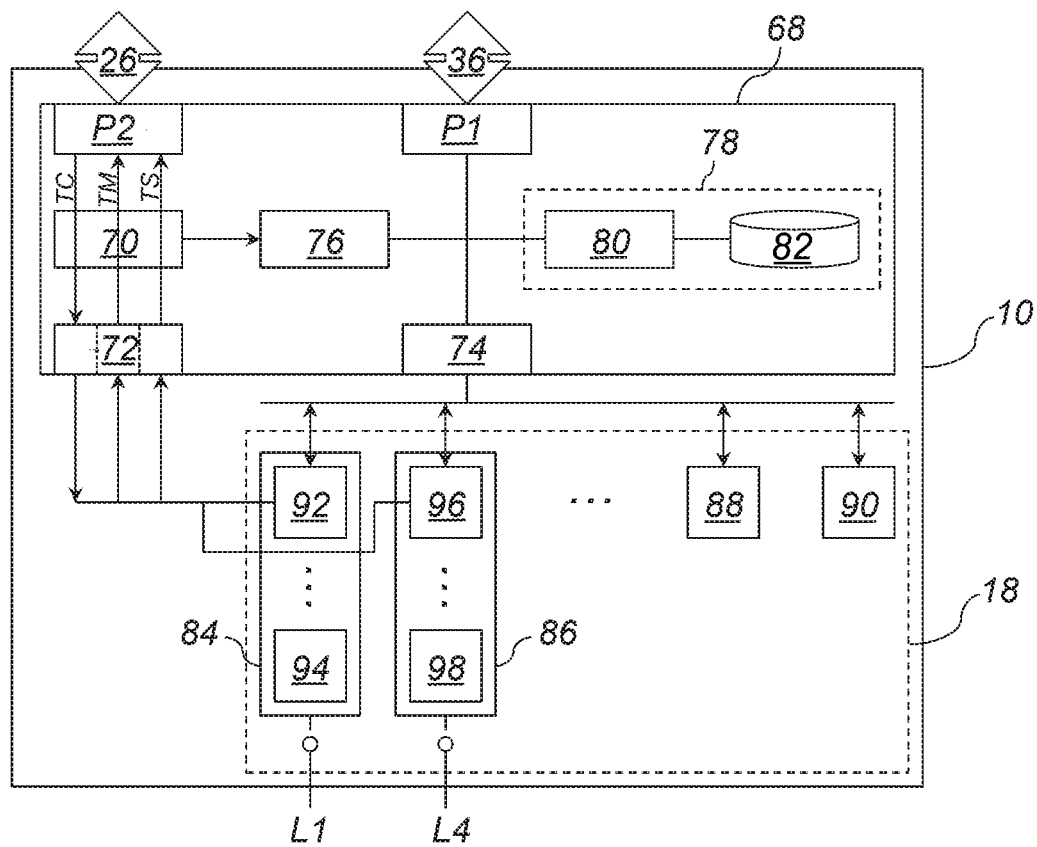

ured to receive, process, and transmit data conforming to the first communication protocol. The main electrical station is connected to each of the other local electrical stations by an additional monitoring network, distinct from the remote control network, implementing the first communication protocol.

13 Claims, 2 Drawing Sheets

(52) U.S. Cl.
CPC .. *H02J 13/0062* (2013.01); *G05B 2219/2639* (2013.01); *Y02E 60/00* (2013.01); *Y04S 10/30* (2013.01); *Y04S 40/124* (2013.01)

(56) References Cited

U.S. PATENT DOCUMENTS

| | | | | |
|---|---|---|---|---|
| 2012/0043813 A1* | 2/2012 | Doi | ............... | H02J 13/0006 307/39 |
| 2012/0089262 A1 | 4/2012 | Wang et al. | | |
| 2013/0066600 A1* | 3/2013 | Rousselle | ............... | H02J 3/00 703/1 |
| 2014/0180616 A1 | 6/2014 | Aaserude et al. | | |
| 2014/0288863 A1* | 9/2014 | Stevenin | ............... | H02J 3/00 702/65 |

OTHER PUBLICATIONS

C. Brunner, "IEC 61850 for power system communication," 2008 IEEE/PES Transmission and Distribution Conference and Exposition, Chicago, IL, 2008, pp. 1-6, doi: 10.1109/TDC.2008.4517287. (Year: 2008).*

IEEE Std 738-2006 (Revision of IEEE Std 738-1993), "IEEE Standard for Calculating the Current-Temperature of Bare Overhead Conductors," IEEE Power Engineering Society as reference IEEE Std 738TM-2006, Jan. 2007, 69 pages.

Working Group 22.12, "Thermal behaviour of overhead conductors", published by the CIGRE organization study committee "B2-overhead lines", Technical Brochure No. 207, Aug. 2002, 2 pages.

Working Group B2.43, "Guide for thermal rating calculations of overhead lines," published by the CIGRE organization study committee "B2-overhead lines", Dec. 2014, 95 pages.

International Search Report dated May 24, 2017 in PCT/FR2017/050110 filed Jan. 19, 2017.

* cited by examiner

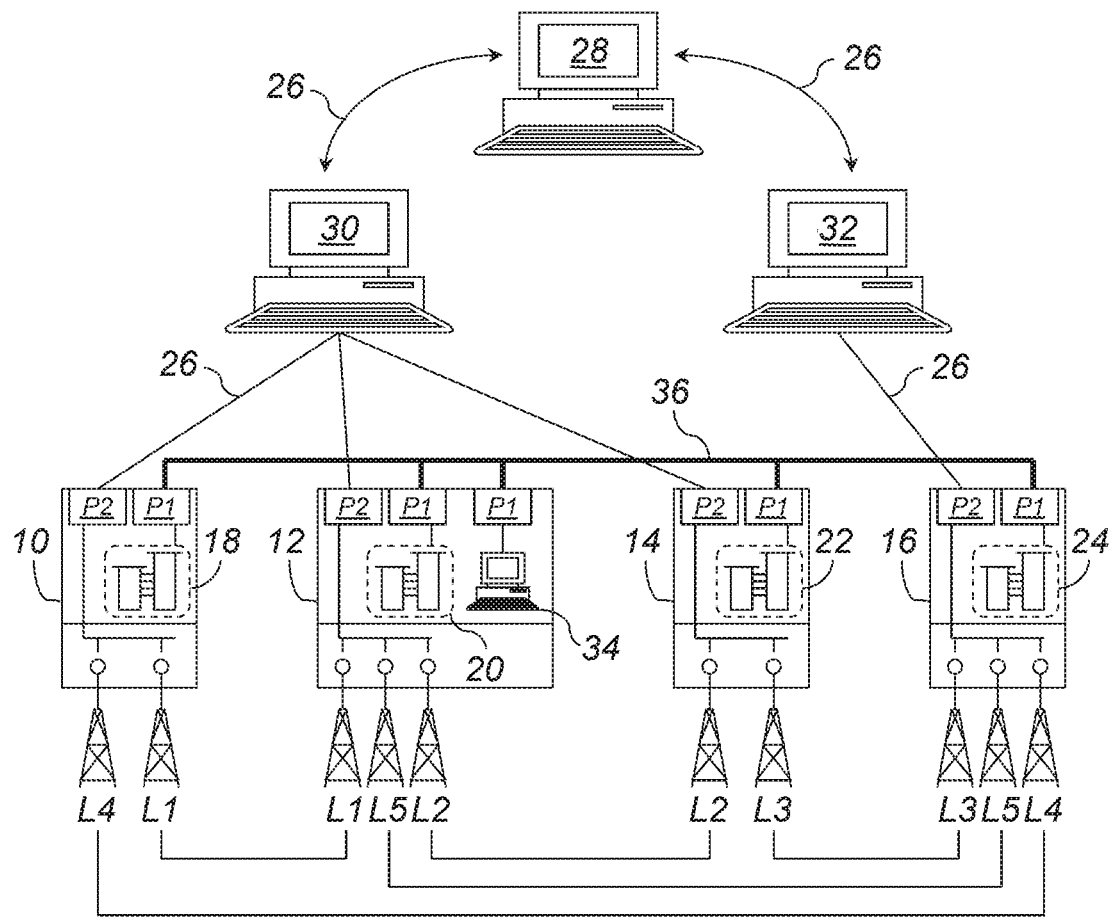
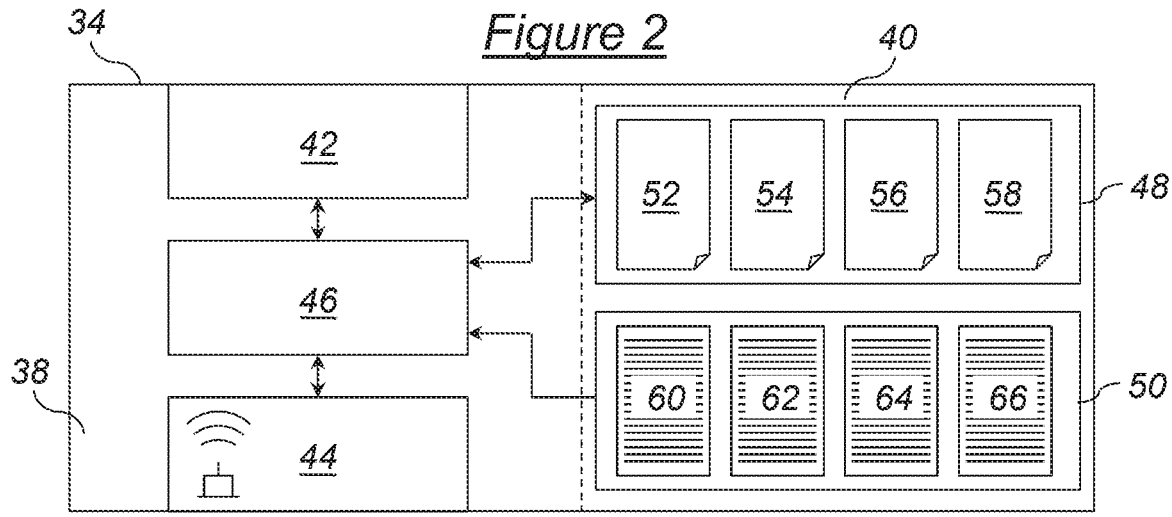

FACILITY FOR MONITORING A PORTION OF A HIGH-VOLTAGE ELECTRICAL POWER TRANSMISSION NETWORK

This invention relates to a facility for monitoring a portion of a high-voltage electrical power transmission network.

More precisely, it relates to a facility comprising:
- several local electrical substations for connection of high-voltage lines, located at each of a plurality of nodes of the network portion, each local electrical substation being electrically connected to at least one high-voltage line end and implementing a first communication protocol dedicated to internal communication between electrical devices that it contains, and
- at least one remote monitoring site connected to each of the local electrical substations by a remote control network implementing a second communication protocol dedicated to this remote control.

The remote control provides the transmission of remote control data from the remote monitoring site(s) to each of the local electrical substations, and remote signaling and remote measurement data from the local electrical substations to the remote monitoring site(s), for operator-controlled management of the state of the network portion. In particular, each local electrical substation has an automated mechanism to detect that at least one local maximum electrical current transmission capacity has been exceeded in the high-voltage line(s) connected to it. Forwarding this information to the remote monitoring site(s) makes not only automated local management of this type of overconsumption possible, but it also makes more global action possible on the network portion, for example to order production curtailments, consumption load shedding or transit cutoffs on high-voltage line.

Unfortunately, with this type of infrastructure it is impossible to have all information available in each of the local electrical substations in the network portion, on the remote site. Therefore resulting actions are limited.

Furthermore, some decisions that have to be taken in the case of an overloaded network, for example during production or consumption peaks, have serious consequences while they may require fast reactivity by operators of the monitoring site(s). Therefore, risks of nonconforming actions or actions that do not make optimal use of the real capacities of the network portion are increased.

It may thus be desirable to provide a facility for monitoring a portion of a high-voltage electrical power transmission network to at least partly overcome the above-mentioned problems and constraints.

Therefore it is proposed a facility for monitoring a portion of a high-voltage electrical power transmission network comprising:
- several local electrical substations for connection of high-voltage lines, located at each of a plurality of nodes of the network portion, each local electrical substation being electrically connected to at least one high-voltage line end and implementing a first communication protocol dedicated to internal communication between electrical devices that it contains,
- at least one remote monitoring site connected to each of the local electrical substations by a remote control network implementing a second communication protocol dedicated to this remote control, wherein:
- one of the local electrical substations, called the main electrical substation, comprises additional automated monitoring means configured to receive, process and transmit data conforming with the first communication protocol,
- this main electrical substation is connected to each of the other local electrical substations by an additional monitoring network, distinct from the remote control network, implementing the first communication protocol.

Thus, due to such a facility, all information coded according to the first communication protocol and initially dedicated to internal exchanges within each local electrical substation, not visible from the remote monitoring site, can advantageously be used on the network. Monitoring of the network portion can be reinforced and improved by forwarding this information to one of the local electrical substations that is itself configured to receive, process and transmit data encoded according to this first protocol, and providing additional automated monitoring means on this electrical substation.

Optionally, the additional monitoring means of the main electrical substation comprise:
- means for storing a model of the network portion, this model containing singular points and at least one high-voltage electrical power conducting line between these singular points, a predetermined thermal equilibrium relation, a limit operating temperature for each conducting line and conduction parameters for each conducting line,
- a computer with access to the storing means, programmed for dynamic determination of optimized maximum capacities for electrical power transmission in high-voltage lines in the network portion starting from the predetermined thermal equilibrium relation, each limit operating temperature, each network conduction parameter and meteorological parameters, and
- means for transmission of the optimized maximum capacities to the respectively concerned local electrical substations in accordance with the first communication protocol.

Also optionally, each local electrical substation comprises:
- a mechanism for local monitoring when at least one local maximum capacity value is exceeded, and
- a programmable logic controller for additional local monitoring associated with a local memory and configured to:
  - receive and store each optimized maximum capacity value related to a high-voltage line, one end of which is electrically connected to this local electrical substation, in local memory,
  - compare each received and stored optimized maximum capacity value with said at least one local maximum capacity value, and
  - replace the local monitoring mechanism by a mechanism for optimized monitoring of exceedance of at least one optimized maximum capacity value stored in local memory under specific predetermined conditions.

Optionally, also:
- each local electrical substation comprises a gateway configured to transcode remote control data conforming with the second communication protocol into remote control signals that can be used internally by each local electrical substation and to transcode remote signaling and remote measurement signals transmitted internally by each local electrical substation into remote signaling and remote measurement data conforming with the second communication protocol, each gateway comprises additional means for transcoding data conforming with the second communication protocol into data conforming with the first communication protocol, a communication port with the electrical devices contained in the local electrical substation in which it is installed and an access port to the additional monitoring network, and each gateway is configured to transmit at least some of the remote control, remote signaling and remote measurement data transcoded according to the first communication protocol with other data originating from the electrical devices contained in the local electrical substation in which it is installed, to the main electrical substation through the additional monitoring network.

Also optionally, the programmable logic controller for additional local monitoring in each local electrical substation and its associated local memory are implemented in the gateway of this local electrical substation.

Also optionally, the additional automated monitoring means are implemented in the gateway of the main electrical substation.

Also optionally, the main electrical substation comprises automated means for detection, positioning and processing of faults in the network portion starting from data transmitted by each gateway through the additional monitoring network.

Also optionally, the main electrical substation comprises automated means for management of congestion of the network portion starting from data transmitted by each gateway through the additional monitoring network, this management including emission of requests for modulated production curtailment, consumption load shedding or transit interruptions on high-voltage line.

Also optionally, the automated means for detection, positioning and processing of faults and the automated means for management of congestion are implemented in the additional monitoring means of the main electrical substation.

Optionally, also:
the first communication protocol complies with standard IEC 61850, and
the second communication protocol complies with standard IEC 60870-5, particularly IEC 60870-5-104.

Figure 4:
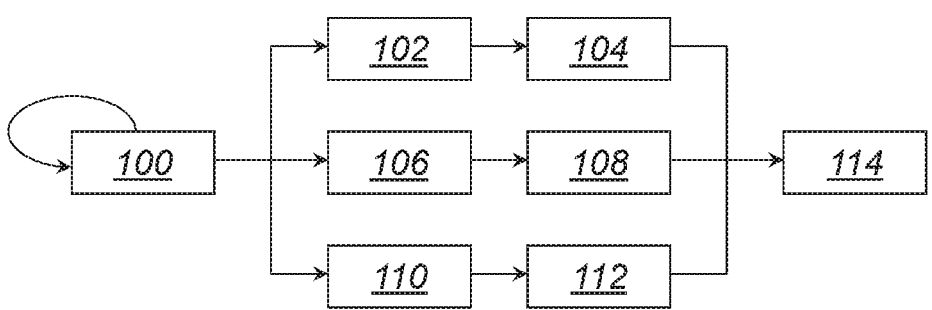

The invention will be better understood with reference to the following description, given purely as an example, with reference to the appended drawings in which:

FIG. 1 diagrammatically represents the general structure of a facility for monitoring a portion of a high-voltage electrical power transmission network, according to one embodiment of the invention, FIG. 2 diagrammatically represents the general structure of automated additional monitoring means located in one of the local electrical substations of the facility in FIG. 1, FIG. 3 diagrammatically and partially represents a structure of a local electrical substation of the facility in FIG. 1, and FIG. 4 illustrates the successive steps of a monitoring method implemented by the facility in FIG. 1.

The facility illustrated diagrammatically on FIG. 1 comprises several electrical substations forming the nodes of a portion of a high-voltage electrical power transmission network. Each local electrical substation is electrically connected to at least one end of a high-voltage line of the network portion. Each high-voltage line is an electrical power transmission or distribution line and extends from one local electrical substation to another in the network portion, being supported by pylons.

In this particular non-limitative example, the network portion 10 comprises four local electrical substations 10, 12, 14 and 16, each being defined by the International Electrotechnical Commission IEC as being a "part of an electrical network, located at the same location, comprising mainly the ends of transmission or distribution lines, electrical equipment, buildings and possibly transformers". Therefore an electrical substation is an element of the electrical power transmission network used for both transmission and distribution of electricity. It steps the electrical voltage up for its transmission at high voltage, and steps it down again for consumption by users (individuals or manufacturers). The relative arrangement of the four electrical substations 10, 12, 14 and 16 is arbitrary and does not correspond to the illustration, in which they are shown in line for convenience. They form the four vertices of an arbitrary quadrilateral in which the length of each side may be several kilometers or even several tens of kilometers.

Also in this particular non-limitative example, the network portion comprises a high-voltage line L1 extending between substation 10 and substation 12, a high-voltage line L2 extending between substation 12 and substation 14, a high-voltage line L3 extending between substation 14 and substation 16, a high-voltage line L4 extending between substation 16 and substation 10, and a high-voltage line L5 extending between substation 12 and substation 16.

The local electrical substation comprises a number of electrical devices symbolized by reference 18. These devices are known per se and will not be described in detail. They are interconnected and managed locally by a first dedicated communication protocol, usually a protocol complying with standard IEC 61850. Similarly, the local electrical substation 12 comprises a number of electrical devices symbolized by reference 20, interconnected and managed locally using the same first communication protocol; the local electrical substation 14 comprises a number of electrical devices symbolized by reference 22, interconnected and managed locally using the same first communication protocol; and the local electrical substation 16 comprises a number of electrical devices symbolized by reference 24, interconnected and managed locally using the same first communication protocol.

The facility illustrated diagrammatically on FIG. 1 also comprises at least one remote monitoring site connected to each of the local electrical substations 10, 12, 14 and 16 by a remote control network 26 implementing a second communication protocol dedicated to this remote control. It may be a communication protocol complying with standard IEC 60870-5, and particularly IEC 60870-5-104. Three remote sites 28, 30 and 32 are shown as an example of a two-level tree structure. A general remote monitoring site 28 communicates with two secondary remote monitoring sites 30, 32 themselves directly connected to local electrical substations. The secondary remote monitoring site 30 is thus in direct communication with local electrical substations 10, 12 and 14 of the illustrated network portion while the secondary remote monitoring site 32 is in direct communication with local electrical substation 16, these communications complying with the second protocol for remote control.

According to the invention, additional monitoring is provided by one of the local electrical substations, specifically the substation 12 that comprises additional automated monitoring means 34 configured to receive, process and transmit data conforming with the first communication protocol. These means 34 may be in the form of a computer. More generally, they comprise a computer associated with means for storing processing data and computer programs. To achieve this, the substation 12 is qualified as the main electrical substation. It is connected to each of the other local electrical substations 10, 14 and 16 by an additional monitoring network 36, distinct from the remote control network 26, implementing the first communication protocol.

Thus, each local electrical substation is provided with a gateway comprising an access port P1 to the additional monitoring network 36 that can be used for exchanges complying with the first communication protocol between local electrical substations, and an access port P2 to the remote control network 26 that can be used for exchanges complying with the second communication protocol between remote monitoring sites 28, 30, 32 and each local electrical substation. The main electrical substation 12 may comprise a second access port P1 to the additional monitoring network 36 for its additional automated monitoring means 34. As a variant, the latter may also have access to the additional monitoring network 36 through the same access port P1 as the electrical devices 20.

The additional automated monitoring means 34 of the main substation 12 are functionally shown in detail on FIG. 2 according to one possible embodiment of the invention. More precisely, they are designed for:

- dynamic determination and management of maximum optimized capacities for transmission of electrical power for the network portion considered,
- automated detection, positioning and processing of faults in the network portion based on data transmitted through the additional monitoring network 36, and
- automated management of congestion of the network portion based on data also transmitted through the additional monitoring network 36, this management including emission of requests for modulated production curtailments, consumption load shedding or transit interruptions on high-voltage line.

Advantageously but optionally, they dynamically determine the optimized maximum capacities from values of wind speeds that they receive regularly in real time, for example from measurements recorded by a set of anemometric stations deployed around the network portion.

These means 34 are used in a computer device such as a classical computer and then comprise a processing unit 38 associated with a memory 40 (for example RAM memory) for the storage of data files and computer programs.

The processing unit 38 comprises an interface 42 conforming with the first communication protocol and that can be connected to one of the access ports P1 of the main electrical substation 12. It also optionally comprises a receiver 44 of wind speed values supplied regularly (for example by a radio network) and a computer 46, for example a microprocessor, capable of processing the values supplied by the interface 42 and the receiver 44.

The memory 40 is partitioned into a first processing data storage area 48 and a second computer program storage area 50. This partition is purely functional, chosen for a clear presentation of the means 34, but does not necessarily reflect the real organization of the memory 40.

The first storage area 48 comprises firstly data 52 related to a model of the network portion considered, this model comprising singular points, including particularly nodes that make up the local electrical substations 10, 12, 14, 16, and at least one high-voltage electrical power conducting line between these singular points. These data include identification and characterization parameters of the singular points and conducting lines in the model, including (apart from topological or geographic considerations), a limit operating temperature and conduction parameters for each conducting line.

The first storage area 48 also comprises data 54 related to a predetermined thermal balance relation. For example, this relation could be a mathematical equation balancing at least mathematical expressions for gains by the Joule effect and solar energy with mathematical expressions for losses by convection and electromagnetic radiation. In particular, it could be a relation derived from the steady state IEEE equation defined in the document entitled "IEEE standard for calculating the current-temperature relationship of bare overhead conductors", published by the IEEE Power Engineering Society as reference IEEE Std 738™-2006, in January 2007. It could also be a relation derived from the steady state CIGRE equation defined in the document entitled "Thermal behaviour of overhead conductors", published by the CIGRE organization study committee "B2-overhead lines", WG 22.12, in August 2002, or specified in the document entitled "Guide for thermal rating calculations of overhead lines", published by the CIGRE organization study committee "B2-overhead lines", WG B2.43, in December 2014. For example, its general form may be:

$$P_J + P_S = P_C + P_R,$$

in which $P_J$ is the thermal gain by the Joule effect, $P_S$ is the thermal gain by solar energy, $P_C$ is the thermal loss by convection and $P_R$ is the thermal loss by electromagnetic radiation. We will refer to the documents mentioned above for examples of detailed expressions of each of these gains or losses.

The first storage area 48 also comprises data 56 related to general weather parameters applicable to the geographic area in which the network portion considered is located. A priori, these parameters can be chosen as being the most sever possible in the environment of the network portion. They may be determined using zoning, statistical calculations, regular measurements, etc. For example, they may comprise values of the ambient temperature and sunshine that depend on the location and the season.

Finally, the first storage area 48 optionally comprises data 58 related to a wind propagation model. There are many more or less technically advanced propagation models. For example, it may be a linear proportional projection model according to which the propagation speed is arbitrarily taken equal to the amplitude of the wind speed, while the propagation direction considered to be plane is the direction of the wind. Such a model is particularly simple and is far from being perfect, but it can already provide good results for a dynamic estimate of the optimized maximum capacities mentioned above. It can be used to build up a history of wind speed values for each point in the model 52 of the network portion, particularly for each singular point. Such a history will become progressively enriched as more wind speed measurements are made.

The second storage area 50 as illustrated on FIG. 1 functionally comprises four computer programs or four functions of the same computer program 60, 62, 64, 66. It will be noted that the computer programs 60, 62, 64, 66 are presented as being distinct, but this distinction is purely functional. They could also be grouped according to any possible combination in one or several items of software. Their functions could also be at least partly micro-programmed or micro-wired in dedicated integrated circuits. Thus as a variant, the computer device using the processing unit 38 and its memory 40 could be replaced by an electronic device composed entirely of digital circuits (with no computer program) to perform the same actions.

The first computer program 60 comprises instruction lines for application of the wind speed propagation model 58 from at least one of the anemometric stations at which wind speed measurements are made to singular points in the model 52 of the network portion, for an estimate of successive values of wind speeds at each singular point based on successive measured values of wind speeds. One non-limitative example of operation of this first program will be described in detail with reference to FIG. 4.

The second computer program 62 comprises instruction lines for execution of the calculation of at least one optimized maximum value of the electrical power transmission capacity at each singular point 54 of the network portion, and particular at each node in the network portion, making use of:

the predetermined thermal equilibrium relation 54,
each recorded limit operating temperature and each recorded network conduction parameter with data in the model 52 of the network portion, and
general meteorological parameters 56, taking account of estimated wind speed values at all singular points by execution of the first program 60, in the predetermined thermal equilibrium relation 54.

More precisely and in accordance with teaching given in the document "Guide for thermal rating calculations of overhead lines" mentioned above, wind speed values can be used in the mathematical expression for loss by convection $P_C$ in the expression $P_J + P_S = P_C + P_R$.

In the example given in FIG. 1, there are two values of optimized maximum capacities that can be calculated at the singular point formed by the local electrical substation 10, one for the high-voltage line L1 and the other for the high-voltage line L4. Three values of optimized maximum capacities can be calculated at the singular point formed by the local electrical substation 12, one for the high-voltage line L1, another for the high-voltage line L2, and the last for the high-voltage line L5. Two values of optimized maximum capacities can be calculated at the singular point formed by the local electrical substation 14, one for the high-voltage line L2 and the other for the high-voltage line L3. Three values of optimized maximum capacities can be calculated at the singular point formed by the local electrical substation 16, one for the high-voltage line L3, another for the high-voltage line L4, and the last for the high-voltage line L5.

The computer 46 is then configured to transmit optimized maximum capacities to each of the local electrical substations concerned through its interface 42, the access port P1 of the main electrical substation 12 and the additional monitoring network 36, in accordance with the first communication protocol.

The third computer program 64 comprises instruction lines for the automated detection, positioning and processing of faults in the network portion making use of data transmitted through the additional monitoring network 36.

The fourth computer program 66 comprises instruction lines for implementing the automated management of congestion of the network portion making use of data transmitted through the additional monitoring network 36.

Elements useful for understanding the invention in any one of the local electrical substations 10, 12, 14, 16 are illustrated on FIG. 3. More specifically, substation 10 is used as an example.

It comprises the set 18 of electrical devices and a gateway 68 configured to enable a data exchange with the remote control network 26.

The gateway 68 thus comprises the access port P2 through which it receives remote control TC data sent by the remote site 30 and sends remote signaling TS or remote measurement TM data to this remote site 30, all these data complying with the second communication protocol. It also comprises a first transcoder 70 for transcoding of remote control TC data into remote control signals that can be used internally by the local electrical substation 10 and for transcoding of remote signaling or remote measurement signals sent internally by electrical devices 18 into remote signaling TS or remote measurement TM data. It also comprises at least three electronic interface boards 72 with electrical devices 18 to exchange remote control, remote signaling and remote measurement data with them.

Moreover, the gateway 68 comprises the access port P1 to the additional monitoring network 36 through which it exchanges data conforming with the first communication protocol. It also comprises a port 74 for communication with the electrical devices 18 according to this same first communication protocol, and a second transcoder 76 for transcoding of TC, TS and TM data conforming with the second communication protocol into data conforming with the first communication protocol. It is then configured to transmit at least some of the remote control TC, remote signaling TS and remote measurement TM data transcoded according to the first communication protocol with other data originating from electrical devices 18, to the main electrical substation 12 through the additional monitoring network 36.

Finally, the gateway 68 comprises an additional local monitoring system 78, for example a computer device comprising a programmable logic controller 80 associated with a local memory 82 and capable of at least temporarily substituting for a local monitoring mechanism that will now be described in detail.

The electrical devices 18 in the local electrical substation 10 comprise a device 84 for monitoring the high-voltage line L1 and a device 86 for monitoring the high-voltage line L4, and other devices 88, 90, etc. that will not be described herein because they are altogether conventional in local electrical substations. All these devices can exchange data with the gateway 68 through the port 74 and a dedicated communication bus.

The device 84 implements the local monitoring mechanism comprising a programmable logic controller 92 for protecting the high-voltage line L1 associated with a memory 94 storing a value of a predefined local maximum capacity, statically indicating an overload value that must not be exceeded, this value possibly depending on the season or other parameters. This programmable logic controller 92 is designed by the application of some rules predefined locally or on reception of specific remote control signals, to trigger specific protection actions for the high-voltage line L1 under specific predetermined circumstances. In particular, these actions may include a cutoff of line L1. The programmable logic controller 92 is more generally designed to exchange remote control, remote signaling and remote measurement signals with the three electronic interface boards 72.

The device 86 uses the local monitoring mechanism in the same way, comprising a programmable logic controller 96 for protecting the high-voltage line L4 associated with a memory 98 storing a value of a predefined local maximum capacity, statically indicating an overload value that must not be exceeded, this value possibly depending on the season or other parameters. This programmable logic controller 96 is designed by the application of some rules predefined locally or on reception of specific remote control signals, to trigger specific protection actions for the high-voltage line L4 under specific predetermined circumstances. In particular, these actions may include a cutoff of line L4. The programmable logic controller 96 is more generally designed so that it also exchanges remote control, remote signaling and remote measurement signals with the three electronic interface boards 72.

The additional local monitoring programmable logic controller 80 is configured to receive any optimized maximum capacity value calculated by the additional automated monitoring means 34 of the main electrical substation 34 for the high-voltage line L1 or L4, and to store them in local memory 82. It is also configured to compare each optimized maximum capacity value received and stored in local memory 82 with the value of the corresponding local maximum capacity stored in memory 94 or 98. Finally, it is configured to replace the local monitoring mechanism 92, 96 by a mechanism for optimized monitoring of exceedance of values of maximum optimized capacities stored in local memory 82 for lines L1 and L4 under specific predetermined conditions. For example, these conditions are defined based on constraints related to measurements from which the optimized maximum capacities were calculated (minimum wind speeds, coherence of measurements, etc.), on a confidence index related to received maximum optimized capacities, or on any other classical consideration left to the judgement of those skilled in the art.

The local electrical substations 14 and 16 are structured in the same way as that described in detail above. Concerning the main electrical substation 12, it further comprises additional automated monitoring means 34 that can be implemented in the same computer device as the device that implements the additional local monitoring system 78. As a variant, they can be implemented in a dedicated computer device outside the gateway 68, connected to the port 74 through a communication bus or its own access port P1 as illustrated on FIG. 1.

FIG. 4 illustrates a non-limitative example of the operation of additional automated monitoring means 34 for the main electrical substation 12.

During a step 100 in which data are collected, the interface 42 conforming with the first communication protocol and the receiver 44 receive all data necessary for the processing mentioned above, and supply it to the computer 46:
  wind speed values supplied by anemometric stations for a real time estimate of wind speeds at nodes in the network portion considered,
  remote control TC, remote signaling TS or remote measurement TM data transcoded into data conforming with the first communication protocol, from each of the local electrical substations 10, 14 and 16 through the additional monitoring network 36, or supplied internally in the main electrical substation 12,
  data originating from electrical devices 18, 20, 22, 24, conforming with the first communication protocol and passing through the additional monitoring network 36 concerning electrical devices 18, 22 and 24 in local electrical substations 10, 14 and 16.

This data collection step is executed in a loop as long as the additional automated monitoring means 34 remain operational and in demand.

It enables execution of a step 102 to calculate values of optimized maximum capacities for each high-voltage line L1 to L5, by execution of the first and second computer programs 60 and 62. As a non-limitative example, this step 102 can begin with the selection of a downwind anemometric station: a main wind direction is determined from the most recent wind speed values received, for example by calculating an angular average of wind directions measured by the different anemometric stations, and the downwind anemometric station is then selected, in other words the station that is furthest upstream along the determined main wind direction. Then, under specific conditions of minimum speeds and consistency between values obtained, wind speeds at each required point of the network portion are estimated by time projection applying the wind propagation model 58. These wind speeds are then used to calculate the optimized maximum capacities by running the computer program 62. At the end of this step, the values obtained are systematically transmitted to the local additional monitoring systems 78 of the local electrical substations concerned by transiting through the additional monitoring network 36.

During the next step 104, if applicable they are applied locally either following a remote order from the additional automated monitoring means 34 of the main electrical substation 12, or by local management of systems 78 (particularly in case of a failure in the additional monitoring network 36). Those skilled in the art will be capable of programming the means 34 or the systems 78 such that application of the optimized maximum capacities instead of the local maximum capacities recorded in memories 94, 98, or the return to these local maximum capacities, takes place intelligently with no sudden transition.

The data collection step 100 also enables execution of a step 106 for detection, positioning and processing of faults in the network portion, by execution of the third computer program 64. Many methods implemented by algorithms and software are already well known and will not be described in detail. The results of this step can be forwarded to remote monitoring sites 28, 30, 32 during a subsequent step 108 or they can be processed directly by the computer 46 and/or the programmable logic controllers 80.

The data collection step 100 also enables execution of a step 110 for automated management of one or several congestions in the network portion by execution of the fourth computer program 66. The computer 46 is programmed to decide upon specific actions to be taken so as to resorb detected congestion, in cooperation with management of optimized maximum capacities in steps 102, 104. Such actions can be transmitted through the additional monitoring network 36 and executed locally during a subsequent step 112: requests for production curtailments, consumption load shedding or transit interruptions on some high-voltage lines. In particular, production curtailment requests can be modulated into partial curtailments strictly necessary and sufficient to eliminate temporary constraints due to intelligent management of maximum capacities of high-voltage lines.

Steps 104, 108 and 112 are followed by a step 114 to stop functioning of the additional automated monitoring means 34 of the main electrical substation 12 when they are no longer in demand or functional.

It is clear that a facility like that described above enables improved monitoring of a portion of a high-voltage electrical power transmission network, so that it can be operated at maximum capacity without the need for the transmission network to be reinforced.

It will also be noted that the invention is not restricted to the embodiment described above. It will be clear to those skilled in the art that various modifications can be made to the embodiment described above, making use of the information disclosed above. The terms used in the following claims must not be interpreted as limiting the claims to the embodiment presented in this description, but must be interpreted to include all equivalents that the claims are intended to cover as a result of their formulation and that can be predicted by those skilled in the art by applying their own general knowledge to implementation of the information disclosed above.

The invention claimed is:

1. A facility for monitoring a portion of a high-voltage electrical power transmission network, comprising:
   plural local electrical substations for connection of high voltage lines, located at each of a plurality of nodes of the network portion, each local electrical substation being electrically connected to at least one high voltage line end and implementing a first communication protocol dedicated to internal communication between electrical devices that it contains;
   at least one remote monitoring site connected to each of the local electrical substations by a remote control network implementing a second communication protocol dedicated to the remote control;
   wherein:
   one of the local electrical substations, as a main electrical substation, comprises an additional automated monitor,
   the main electrical substation is connected to each of the other local electrical substations by an additional monitoring network, distinct from the remote control network, the additional monitoring network implementing the first communication protocol, and
   the additional automated monitor having a processor, being connected to the additional monitoring network, and being configured to receive, process, and transmit data conforming with the first communication protocol over the additional monitoring network;
   wherein the additional automated monitor of the main electrical substation comprises:
   a memory configured to store a model of the network portion, the model containing singular points and at least one high-voltage electrical power conducting line between these singular points, a predetermined thermal equilibrium relation, a limit operating temperature for each conducting line and conduction parameters for each conducting line,
   a computer with access to the memory, programmed for dynamic determination of optimized maximum capacities for electrical power transmission in high-voltage lines in the network portion starting from the predetermined thermal equilibrium relation, each limit operating temperature, each network conduction parameter, and meteorological parameters, and
   a transmitter for transmission of the optimized maximum capacities to the respectively concerned local electrical substations in accordance with the first communication protocol; and
   wherein each local electrical substation comprises:
   a programmable logic controller for local monitoring when at least one local maximum capacity value is exceeded, and
   an additional programmable logic controller for additional local monitoring associated with a local memory and configured to:
   receive and store each optimized maximum capacity value transmitted by the additional automated monitor of the main electrical substation and related to a high-voltage line, one end of which is electrically connected to the local electrical substation, in local memory,
   compare each received and stored optimized maximum capacity value with the at least one local maximum capacity value, and
   replace the local monitoring by an optimized monitoring of exceedance of at least one optimized maximum capacity value stored in local memory, under specific predetermined conditions.

2. The monitoring facility as claimed in claim 1, wherein:
   each local electrical substation comprises a gateway configured to transcode remote control data conforming with the second communication protocol into remote control signals that can be used internally by each local electrical substation and to transcode remote signalling and remote measurement signals transmitted internally by each local electrical substation into remote signalling and remote measurement data conforming with the second communication protocol;
   each gateway comprises a transcoder to transcode data conforming with the second communication protocol into data conforming with the first communication protocol, a communication port with the electrical devices contained in the local electrical substation in which it is installed, and an access port to the additional monitoring network; and
   each gateway is configured to transmit at least some of the remote control, remote signaling, and remote measurement data transcoded according to the first communication protocol with other data originating from the electrical devices contained in the local electrical substation in which it is installed, to the main electrical substation through the additional monitoring network.

3. The monitoring facility as claimed in claim 2, wherein the additional automated monitor is implemented in the gateway of the main electrical substation.

4. The monitoring facility as claimed in claim 2, wherein the main electrical substation comprises a processor programmed for detection, positioning, and processing of faults in the network portion starting from data transmitted by each gateway through the additional monitoring network.

5. The monitoring facility as claimed in claim 2, wherein the main electrical substation comprises a processor programmed for management of congestion of the network portion starting from data transmitted by each gateway through the additional monitoring network, the management including emission of requests for modulated production curtailment, consumption load shedding, or transit interruptions on high-voltage line.

6. The monitoring facility as claimed in claim 1, wherein the additional programmable logic controller for additional local monitoring in each local electrical substation and its associated local memory are implemented in the gateway of the local electrical substation.

7. The monitoring facility as claimed in claim 1, wherein a processor programmed for detection, positioning, and processing of faults and for management of congestion is implemented in the additional automated monitor of the main electrical substation.

8. The monitoring facility as claimed in claim 1, wherein:
   the first communication protocol complies with standard IEC 61850, and
   the second communication protocol complies with standard IEC 60870-5.

9. The monitoring facility as claimed in claim 1, wherein the main electrical substation is connected to a first end of a first one of the high voltage power lines and another one of the local electrical substations is connected to a second end of the first one of the high voltage power lines.

10. The monitoring facility as claimed in claim 1, wherein each of the local electrical substations and the main electrical substation is directly connected to one of the high voltage power lines at a respective one of the plurality of nodes of the network portion.

11. The monitoring facility as claimed in claim 1, wherein the specific predetermined conditions are defined based on constraints related to measurements from which each received and stored optimized maximum capacity value has been calculated.

12. The monitoring facility as claimed in claim 11, wherein the constraints include minimum wind speeds or coherence of measurements.

13. The monitoring facility as claimed in claim 1, wherein the specific predetermined conditions are defined based on a confidence index related to each received and stored optimized maximum capacity value.

* * * * *